(12) United States Patent
Kwak (10) Patent No.: US 6,768,361 B2
(45) Date of Patent: Jul. 27, 2004

(54) CLOCK SYNCHRONIZATION CIRCUIT

(75) Inventor: Jong Tae Kwak, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/236,287

(22) Filed: Sep. 6, 2002

(65) Prior Publication Data

US 2003/0117191 A1 Jun. 26, 2003

(30) Foreign Application Priority Data

Dec. 21, 2001 (KR) ........................................ 2001-82254

(51) Int. Cl.[7] .............................................. H03L 7/06
(52) U.S. Cl. ..................................... 327/158; 327/149
(58) Field of Search ................................. 327/158, 149, 327/150, 153, 161, 141, 113

(56) References Cited

U.S. PATENT DOCUMENTS

| | | | | |
|---|---|---|---|---|
| 4,288,750 A | * | 9/1981 | Newton et al. | 327/113 |
| 5,391,996 A | * | 2/1995 | Marz | 327/158 |
| 5,610,543 A | | 3/1997 | Chang et al. | 327/158 |
| 5,923,611 A | | 7/1999 | Ryan | 365/233 |
| 5,995,443 A | | 11/1999 | Farmwald et al. | 365/233 |
| 6,034,918 A | | 3/2000 | Farmwald et al. | 365/233 |
| 6,038,195 A | | 3/2000 | Farmwald et al. | 365/233 |
| 6,081,462 A | | 6/2000 | Lee | 365/194 |
| 6,101,152 A | | 8/2000 | Farmwald et al. | 365/233 |
| 6,215,726 B1 | | 4/2001 | Kubo | 365/233 |
| 2002/0097592 A1 | * | 7/2002 | Komurasaki et al. | 363/157 |

FOREIGN PATENT DOCUMENTS

| | | |
|---|---|---|
| JP | 11-120768 | 4/1999 |
| JP | 11-298462 | 10/1999 |

\* cited by examiner

*Primary Examiner*—Linh M. Nguyen
(74) *Attorney, Agent, or Firm*—Marshall, Gerstein & Borun LLP (57) ABSTRACT

A clock synchronization circuit using a phase mixer is disclosed. The clock synchronization circuit generates an internal clock signal having a phase between phases of two clock signals generated in two variable delay lines with a predetermined phase difference by using the phase mixer, thereby precisely synchronizing the clock signal. When a shift register for controlling the variable delay line performs a shift operation, the output clock signal from the variable delay line where the shift operation is performed is not inputted to the phase mixer, but the output clock signal from the other variable delay line is inputted to the phase mixer. As a result, jitter elements generated due to the shift operation do not influence the internal clock signal.

10 Claims, 9 Drawing Sheets

CLOCK SYNCHRONIZATION CIRCUIT

BACKGROUND

1. Technical Field

The present invention relates to a clock synchronization circuit that is able to compensate for a skew between an external clock signal and an internal clock signal and, in particular, to a clock synchronization circuit that can precisely synchronize clock signals regardless of noise generated due to shift in delay lines by using two delay lines and a phase mixer.

2. Description of the Background Art

In general, a clock synchronization circuit such as a delay locked loop (DLL), or a phase locked loop (PLL) is used as a clock generating device for compensating for a skew between an external clock signal and an internal clock signal.

Figure 1:
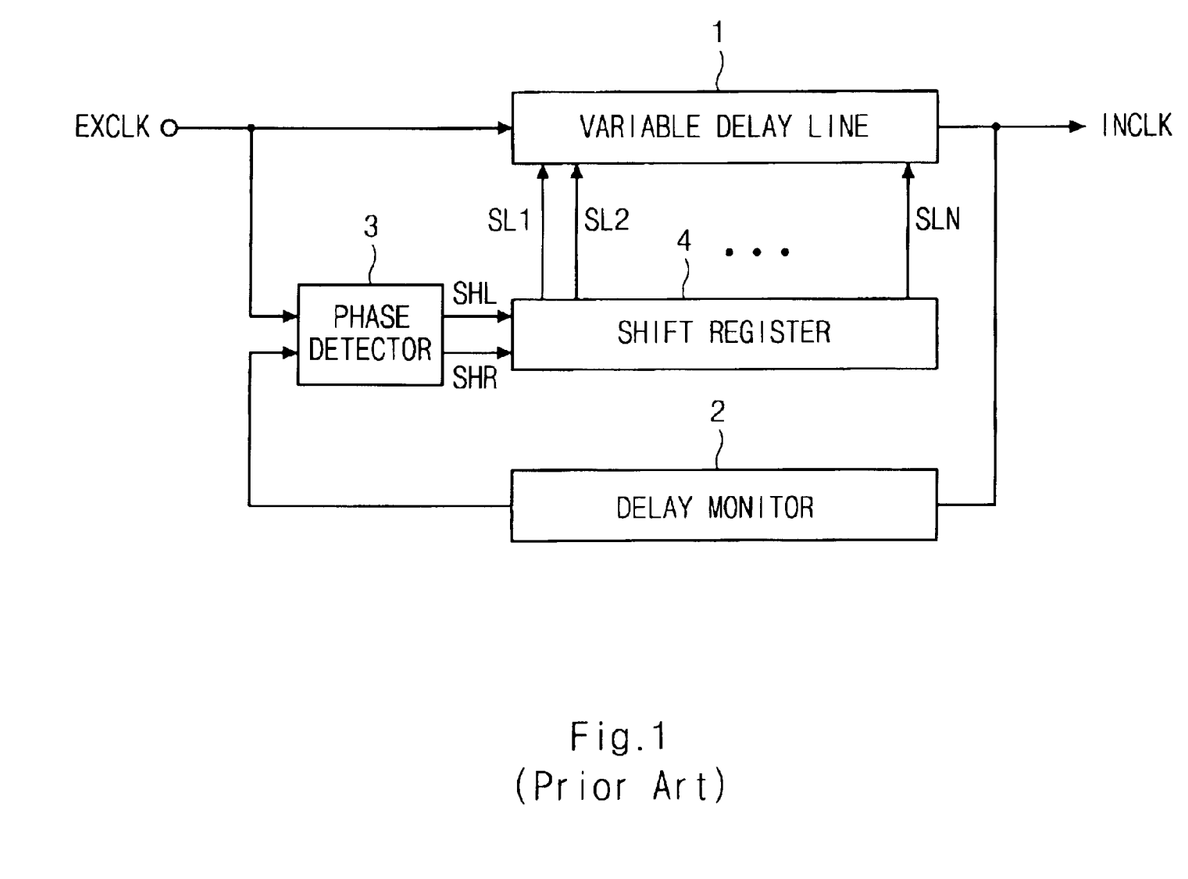
FIG. 1 is a block diagram illustrating a conventional clock synchronization circuit.

Referring to FIG. 1, a conventional clock synchronization circuit includes: a variable delay line 1 for delaying an external clock signal EXCLK for a predetermined time and for generating an internal clock signal INCLK; a delay monitor 2 for monitoring a delay time of the internal clock signal INCLK from the variable delay line 1; a phase detector 3 for comparing a phase difference between the external clock signal EXCLK and the internal clock signal INCLK, and outputting shift signals SHL and SHR for adjusting the phase difference; and a shift register 4 for controlling the delay time of the variable delay line 1 according to the shift signals SHL and SHR from the phase detector 3.

The variable delay line 1 delays the external clock signal EXCLK for a predetermined time, and outputs the internal clock signal INCLK. Here, the internal clock signal INCLK is inputted to the phase detector 3 through the delay monitor 2, so that the phase detector 3 judges whether the internal clock signal INCLK has a faster or slower phase than the external clock signal EXCLK.

The phase detector 3 controls the shift register 4 according to the shift signals SHL and SHR, so that the external clock signal EXCLK and the internal clock signal INCLK have the same phase.

The shift register 4 outputs control signals SL1–SLN according to the shift signals SHL and SHR. The variable delay line 1 controls a delay time of the external clock signal EXCLK so that a phase of the external clock signal EXCLK can be synchronized with a phase of the internal clock signal INCLK.

Figure 2:
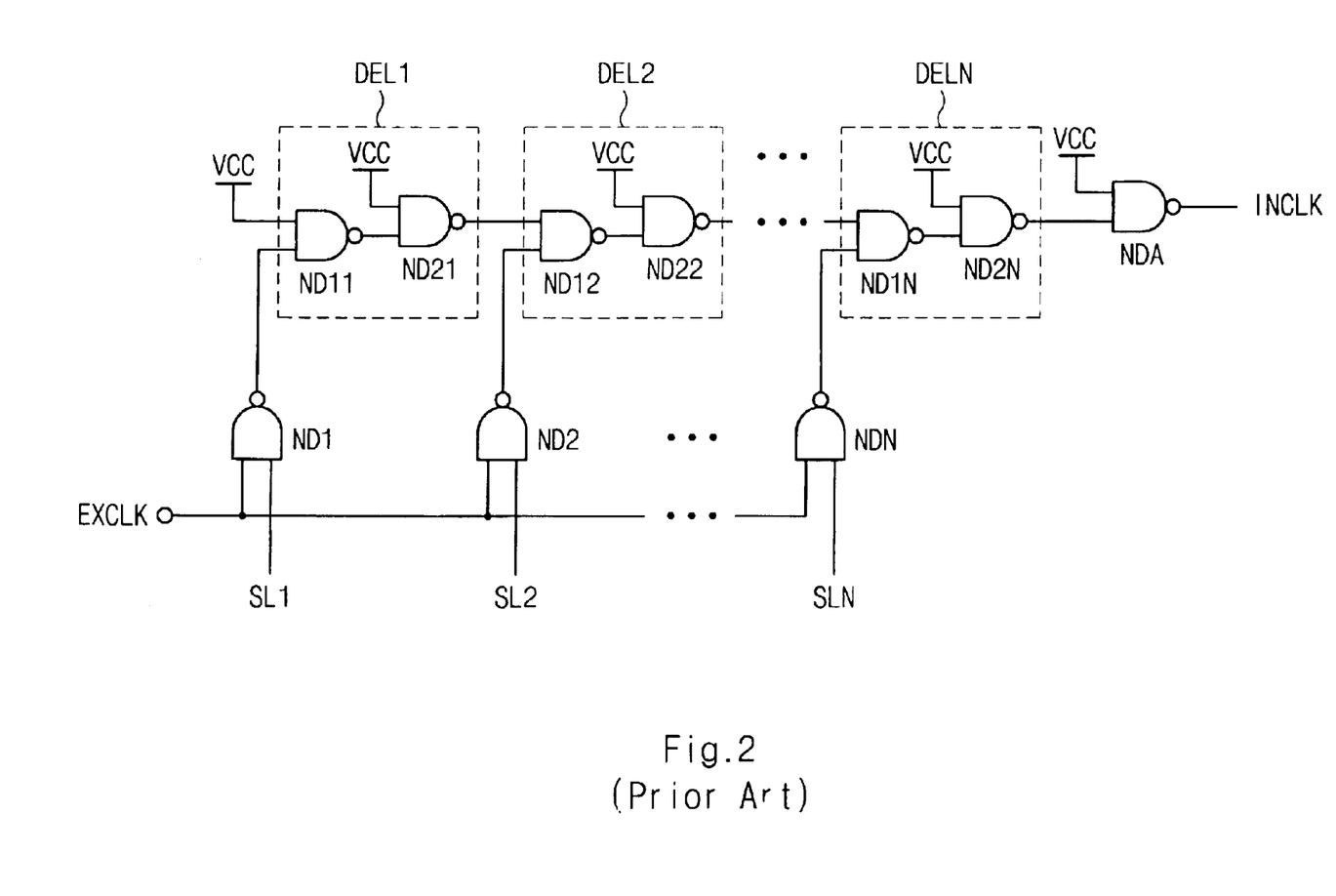
FIG. 2 is a detailed circuit diagram illustrating a variable delay line of FIG. 1.

As shown in FIG. 2, the variable delay line 1 includes: NAND gates ND1–NDN for selectively outputting the external clock signal EXCLK according to the output signals SL1–SLN from the shift register 4; unit delay cells DEL1–DELN connected in series for delaying the external clock signal EXCLK selectively outputted by the NAND gates ND1–NDN; and a NAND gate NDA for NANDing a power voltage VCC and the output signal from the last unit delay cell DELN and for outputting the internal clock signal INCLK.

Here, the unit delay cell DELi includes: a NAND gate ND1$i$ for NANDing the output signal from the previous unit delay cell DEL(i–1) and the output signal from the NAND gate NDi; a NAND gate ND2$i$ for NANDing the power voltage VCC and the output signal from the NAND gate ND1$i$.

The operation of the conventional clock synchronization circuit will now be explained.

When it is presumed that the second signal of the output signals SL1–SLN from the shift register 4 has a high level and the other signals SL1–SL(N–2) and SLN have a low level in an early stage, the external clock signal EXCLK is delayed through a delay path from the second delay cell DEL(N–1) to the last delay cell DELN, and outputted as the internal clock signal INCLK.

Here, the phase detector 3 compares the phase of the external clock signal EXCLK with the phase of the internal clock signal INCLK. When the phase of the external clock signal EXCLK is faster than that of the internal clock signal INCLK, the phase detector 3 outputs the control signal SHL to shift left the shift register 4.

Because the second signal SL(N–1) of the output signals SL1–SLN from the shift register 4 has a high level and the other signals SL1-SL(N–2) and SLN have a low level in an early stage, the third signal SL(N–2) of the output signals SL1–SLN from the shift register 4 has a high level and the other signals SL1-SL(N–3), SL(N–1) and SLN have a low level according to the control signal SHL from the phase detector 3. Accordingly, the external clock signal EXCLK is delayed through a delay path from the third delay cell DEL(N–2) to the last delay cell DELN, and outputted as the internal clock signal INCLK.

Conversely, when the phase detector 3 compares the phase of the external clock signal EXCLK with the phase of the internal clock signal INCLK, if the phase of the external clock signal EXCLK is slower than that of the internal clock signal INCLK, the phase detector 3 outputs the control signal SHR to shift right the shift register 4. Because the second signal SL(N–1) of the output signals SL1–SLN from the shift register 4 has a high level and the other signals SL1-SL(N–2) and SLN have a low level in an early stage, the first signal SLN of the output signals SL1–SLN from the shift register 4 has a high level and the other signals SL1-SL(N–1) have a low level according to the control signal SHR from the phase detector 3. Therefore, the external clock signal EXCLK is delayed through a delay path of the last delay cell DELN, and outputted as the internal clock signal INCLK.

In the conventional clock synchronization circuit for the semiconductor memory device, the variable delay line 1 includes the unit delay cells DEL1–DELN connected in series and each respectively having two serially-connected NAND gates.

Accordingly, a number of the unit delay cells DELi increases or decreases to adjust a delay time. Here, the shift right or left is performed in unit delay cell units according to the output signals SL1–SLN from the shift register 4 to increase or decrease the number of the unit delay cells DELi.

Figure 3:
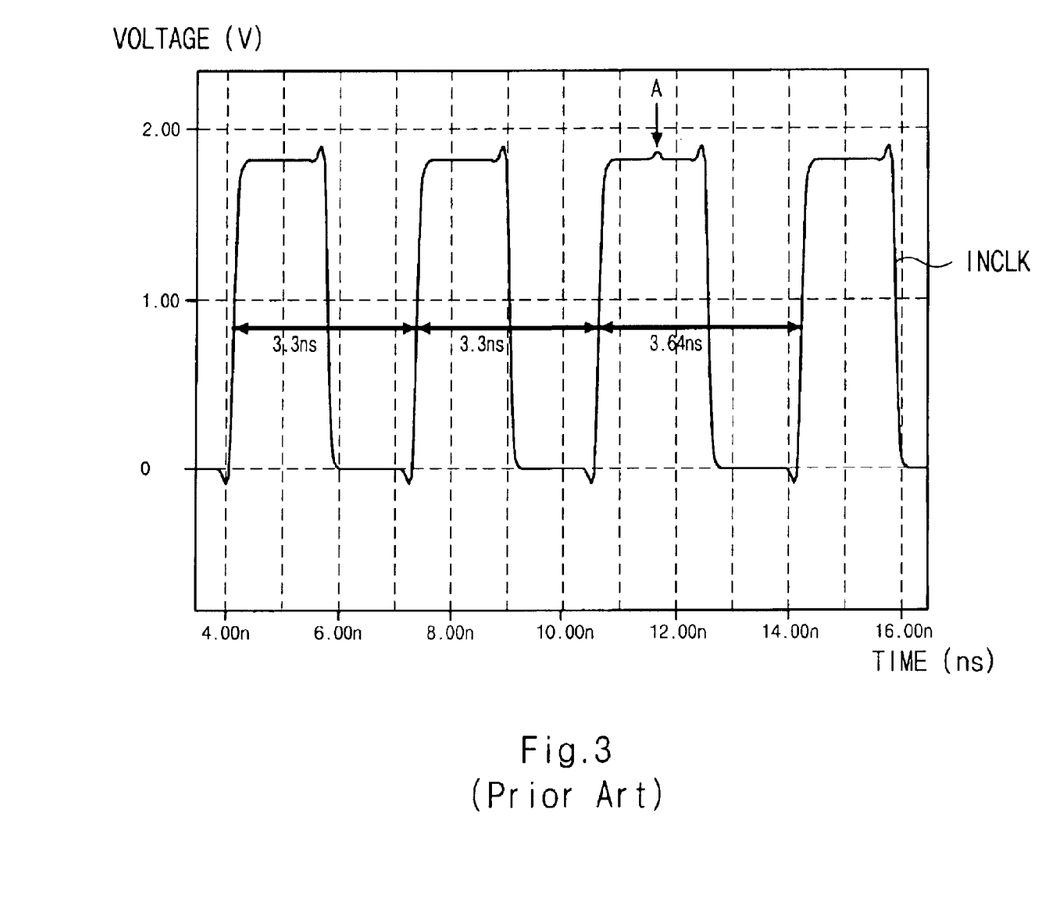
FIG. 3 is a simulation result diagram illustrating a timing of an internal clock signal in FIG. 1.

However, the phase is suddenly changed for a time period as long as the delay time of the unit delay cell DELi. As shown in FIG. 3, when the shift is generated in time point 'A,' the internal clock signal INCLK has a jitter. In addition, a pulse width of the clock varies, and thus a clock period is changed.

SUMMARY

A clock synchronization circuit may include at least two variable delay lines for respectively delaying an external clock signal for a different delay time and at least two shift registers for respectively controlling the delay time of the variable delay lines. The circuit may also include a phase mixer for mixing phases of the clock signals delayed by the variable delay lines, and outputting an internal clock signal having a phase between the phases of the delayed clock signals; a phase detecting unit for comparing the phase of the external clock signal with the phase of the internal clock signal, and outputting the result; and a control unit for outputting a first control signal for determining the phase of the internal clock signal from the phase mixer, and a second control signal for controlling a shift operation of at least one shift register among the shift registers according to the comparison result of the phase detecting unit.

A second clock synchronization circuit may include a normal internal clock signal generator for generating a normal internal clock signal to be synchronized with an external clock signal and an inverted internal clock signal generator for outputting an inverted internal clock signal to be synchronized with a phase-shifted clock signal of the external clock signal. In such an arrangement, the normal internal clock signal is transmitted to circuits operated on a rising edge of the internal clock signal and the inverted internal clock signal is transmitted to circuits operated on a falling edge of the clock signal.

DETAILED DESCRIPTION

Figure 4:
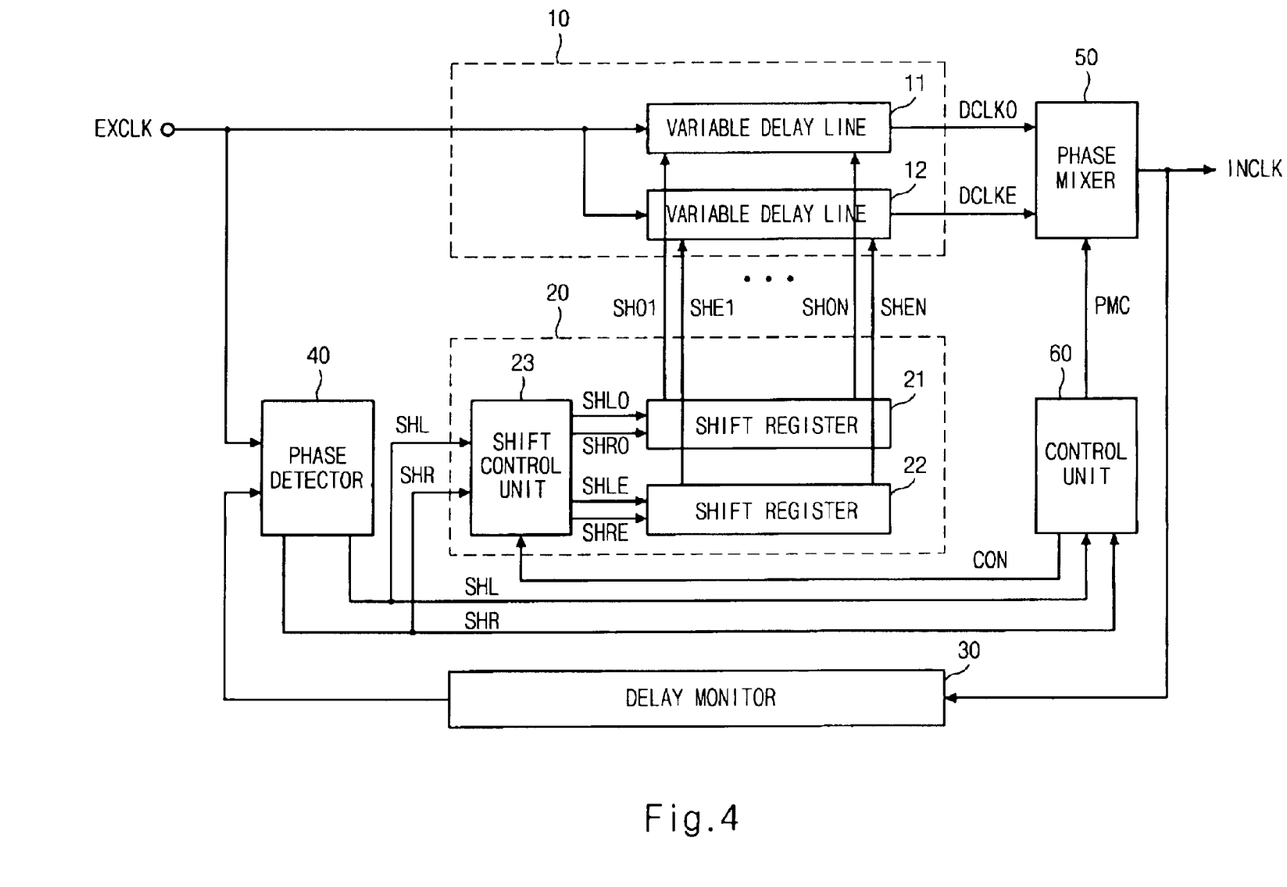
FIG. 4 is a block diagram illustrating a first clock synchronization circuit.

Turning now to FIG. 4, the clock synchronization circuit includes a variable delay unit 10 having two variable delay lines 11 and 12 for respectively delaying an external clock signal EXCLK for a different delay time, a shift register unit 20 having two shift registers 21 and 22 for respectively controlling the two variable delay lines 11 and 12 of the variable delay unit 10 and a delay monitor 30. The circuit also includes a phase detecting unit 40 for comparing a phase of the external clock signal EXCLK with a phase of an internal clock signal INCLK, as well as a phase mixer 50 for mixing phases of two delay clock signals DCLKO and DCLKE from the two variable delay lines 11 and 12 of the variable delay unit 10. The circuit also includes a control unit 60 for controlling a phase mixing operation of the phase mixer 50 and a shift operation of the two shift registers 21 and 22 of the shift register unit 20.

Each of the two variable delay lines 11 and 12 of the variable delay unit 10 respectively delays the external clock signal EXCLK for a different delay time. The two variable delay lines 11, 12 output two delay clock signals DCLKO and DCLKE. The first variable delay line 11 delays the external clock signal EXCLK through a delay path of an odd number (2N-1) of unit delay cells DELOi, and outputs the delay clock signal DCLKO. The second variable delay line 12 delays the external clock signal EXCLK through a delay path of an even number (2N) of unit delay cells DELEi, and outputs the delay clock signal DCLKE. Accordingly, when all of the unit delay cells DELOi and DELEi have the same constitution, a phase difference between the two delay clock signals DCLKO and DCLKE from the two variable delay lines 11 and 12 is a delay time of one unit delay cell DELOi or DELEi.

The shift register unit 20 includes a shift control unit 23 for outputting control signals SHLO, SHRO, SHLE and SHRE for indicating which of the shift registers 21 and 22 must perform the shift operation using the output signals SHL and SHR from the phase detector 40 according to an output signal CON from the control unit 60.

The phase mixer 50 mixes the phase of the delay clock signal DCLKO from the first variable delay line 11 and the phase of the delay clock signal DCLKE from the second variable delay line 12, and outputs the internal clock signal having a phase between the phases of the two clock signals DCLKO and DCLKE.

The control unit 60 controls the operation of the phase mixer 50 by outputting a control signal PMC. Here, the control unit 60 sets up the control signals PMC so that the internal clock signal INCLK from the phase mixer 50 has a phase between the phases of the two delay clock signals DCLKE and DCLKO from the two variable delay lines 11 and 12. In addition, the control unit 60 controls the operation of the shift register unit 20 by outputting the control signal CON. When the phase difference between the internal clock signal INCLK from the phase mixer 50 and the external clock signal EXCLK is over the delay time of one unit delay cell DELOi or DELEi, one of the shift registers 21 and 22 of the shift register unit 20 performs the shift operation according to the control signal CON.

Figure 5A:
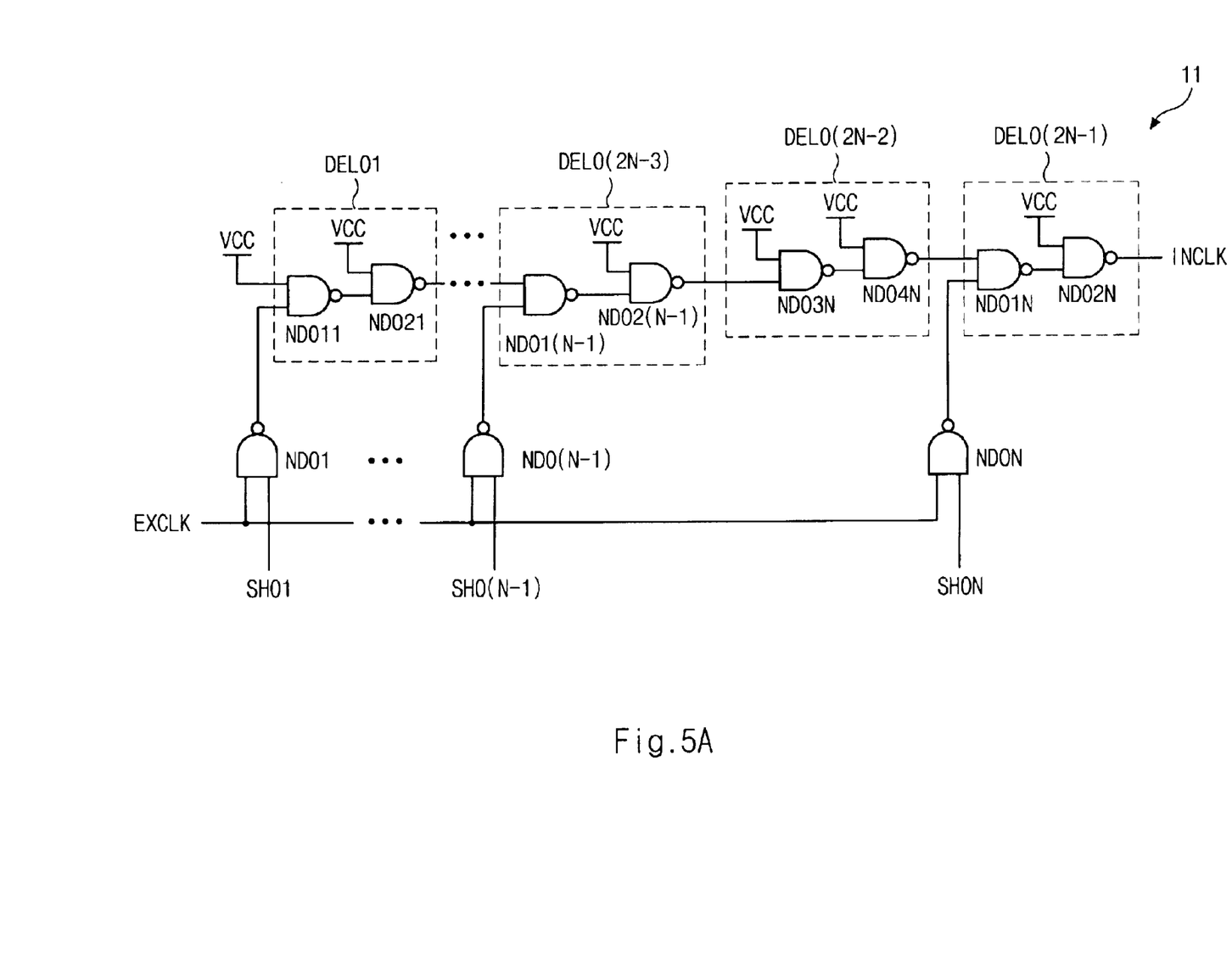
FIGS. 5a and 5b are detailed circuit diagrams respectively illustrating two variable delay lines of FIG. 4.
Figure 5B:
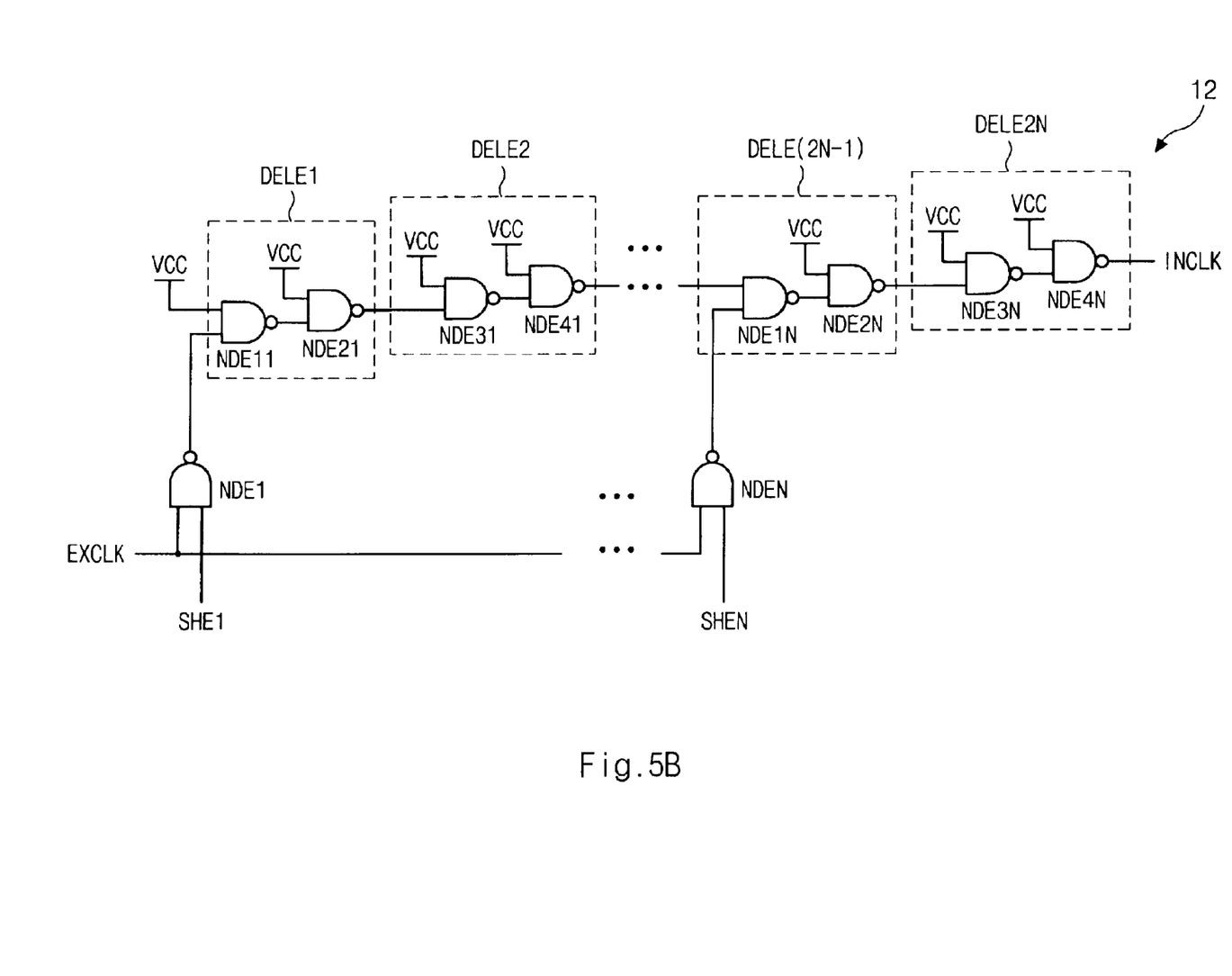

FIGS. 5a and 5b are detailed circuit diagrams respectively illustrating the two variable delay lines 11 and 12 of the variable delay unit 10 in the clock synchronization circuit of FIG. 4.

Referring to FIG. 5a, the first variable delay line 11 delays the external clock signal EXCLK through the delay path of the odd number of unit delay cells DELOi according to shift signals SHO1–SHON from the first shift register 21 of the shift register unit 20. That is, the two unit delay cells DELOi are shifted at a time according to the shift signals SHO1–SHON.

The first variable delay line 11 includes NAND gates NDO1–NDON for selectively outputting the external clock signal EXCLK according to the shift signals SHO1–SHON from the first shift register 21 of the shift register unit 20. The first variable delay line 11 also includes unit delay cells DELO1–DELO2N connected in series for delaying the external clock signal EXCLK selectively outputted by the NAND gates NDO1–NDON.

The odd unit delay cell DELO(2N−1) includes a NAND gate NDO1N for NANDing the output signal from the previous unit delay cell DELO(2N−2) and the output signal from the NAND gate NDON, as well as a NAND gate NDO2N for NANDing the power voltage VCC and the output signal from the NAND gate NDO1N.

The even unit delay cell DELO(2N−2) includes a NAND gate NDO3N for NANDing the output signal from the previous unit delay cell DELO(2N−3) and the power voltage VCC. The even unit delay cell DELO (2N−2) also includes a NAND gate NDO4N for NANDing the power voltage VCC and the output signal from the NAND gate NDO3N.

As depicted in FIG. 5b, the second variable delay line 12 delays the external clock signal EXCLK through the even number of unit delay cells DELEi according to shift signals SHE1–SHEN from the second shift register 22 of the shift register unit 20. That is, the two unit delay cells DELEi are shifted at a time according to the shift signals SHE1–SHEN.

The second variable delay line 12 includes NAND gates NDE1–NDEN for selectively outputting the external clock signal EXCLK according to the shift signals SHE1–SHEN from the second shift register 22 of the shift register unit 20. The second variable delay line 12 also includes unit delay cells DELE1–DELE2N connected in series for delaying the external clock signal EXCLK selectively outputted by the NAND gates NDE1–NDEN.

Here, the even unit delay cell DELE(2N−1) includes a NAND gate NDE1N for NANDing the output signal from the previous unit delay cell DELE(2N−2) and the output signal from the NAND gate NDEN, as well as a NAND gate NDE2N for NANDing the power voltage VCC and the output signal from the NAND gate NDE1N.

The odd unit delay cell DELE2N includes a NAND gate NDE3N for NANDing the output signal from the previous unit delay cell DELO(2N−1) and the power voltage VCC and a NAND gate NDE4N for NANDing the power voltage VCC and the output signal from the NAND gate NDE3N.

In operation, when it is presumed that the second signal SHO(N−1) of the output signals SHO1–SHON from the first shift register 21 of the shift register unit 20 has a high level and the other signals SHO1-SHO(N−2) and SHON have a low level in an early stage, the external clock signal EXCLK is delayed through a delay path from the third delay cell DELO(2N−3) to the last delay cell DELO(2N−1) to output the delay clock signal DCLKO to the phase mixer 50. When it is presumed that the second signal SHE(N−1) of the output signals SHE1–SHEN from the second shift register 22 of the shift register unit 20 has a high level and the other signals SHE1-SHE(N−2) and SHEN have a low level, the external clock signal EXCLK is delayed through a delay path from the fourth delay cell DELO(2N−3) to the last delay cell DELO2N to output the delay clock signal DCLKE to the phase mixer 50.

According to the control signal PMC from the control unit 60, the phase mixer 50 outputs the internal clock signal INCLK having a phase between the phases of the two delay clock signals DCLKO and DCLKE. Here, the phase difference between the two delay clock signals DCLKO and DCLKE transmitted to the phase mixer 50 is a delay time of the unit delay cell.

Therefore, the control unit 60 outputs the internal clock signal INCLK having a phase between the phases of the two input signals DCLKO and DCLKE according to the control signal PMC for determining the phase of the internal clock signal INCLK to be approximate to the phase of the first delay clock signal DCLKO or the phase of the second delay clock signal DCLKE.

The operation of the phase mixer 50 is defined by following Formula 1:

$$INCLK=DCLKO*(1-\alpha)+DCLKE*\alpha \quad \text{Formula 1}$$

Here, '$\alpha$' is determined by the control signal PMC from the control unit 60. When '$\alpha$' is increased, the internal clock signal INCLK has a phase approximately equal to the phase of the second delay clock signal DCLKE. When '$\alpha$' is decreased, the internal clock signal INCLK has a phase approximately equal to the phase of the first delay clock signal DCLKO.

The operation of the clock synchronization circuit when the phase of the external clock signal EXCLK is faster than that of the internal clock signal INCLK will now be explained.

First, when '$\alpha$' is set up to be zero (0) in Formula 1, the phase mixer 50 outputs the internal clock signal INCLK having the same phase as the first delay clock signal DCLKO. This condition is maintained until the phase of the internal clock signal INCLK is approximately equal to the phase of the external clock signal EXCLK to some extent.

Thereafter, when the phase of the internal clock signal INCLK is approximately equal to the phase of the external clock signal EXCLK to some extent, '$\alpha$' is gradually increased in Formula 1, so that the phase of the internal clock signal INCLK can be approximately equal to the phase of the second delay clock signal DCLKE. That is, the phase of the internal clock signal INCLK is minutely increased. Such a procedure is repeated until the phase of the internal clock signal INCLK is identical to the phase of the external clock signal EXCLK. Here, a value of '$\alpha$' is determined according to constitution of the phase mixer 50.

When the phase of the internal clock signal INCLK from the phase mixer 50 is increased to the phase of the second delay clock signal DCLKE by the control signal PMC from the control unit 60, namely when '$\alpha$' is one (1), if the phase of the internal clock signal INCLK is still faster than that of the external clock signal EXCLK, the control unit 60 outputs the control signal CON to shift left the first shift register 21 by the shift control unit 23 of the shift register unit 20. Therefore, the third control signal SHO(N−2) has a high level and the other control signals SHO1-SHO(N−3), SHO(N−1) and SHON have a low level to form a delay path from the fifth unit delay cell DELO(2N−5) to the last unit delay cell DELO(2N−1), thereby newly outputting the first delay clock signal DELCO. Here, the second delay clock signal DCLKE is delayed through the delay path of the second variable delay line 12 to output the second delay clock signal DCLKE.

Thereafter, the phase of the internal clock signal INCLK is minutely controlled according to the control signal PMC from the control unit 60. That is, '$\alpha$' is gradually decreased from '1' so that the phase of the internal clock signal INCLK can be approximately the same as the phase of the first delay clock signal DCLKO. Accordingly, the internal clock signal INCLK is outputted with the minutely-increased phase. Such a procedure is repeated until the phase of the internal clock signal INCLK is identical to the phase of the external clock signal EXCLK.

Conversely, when the phase of the external clock signal EXCLK is slower than that of the internal clock signal INCLK, '$\alpha$' is set up to be one (1) in Formula 1 in an early stage, and thus the internal clock signal INCLK has the same phase as the second delay clock signal DCLKE. This condition is maintained until the phase of the internal clock signal INCLK is approximately equal to the phase of the external clock signal EXCLK to some extent.

When the phase of the internal clock signal INCLK is approximately the same as the phase of the external clock signal EXCLK to some extent, '$\alpha$' is gradually decreased in Formula 1 so that the phase of the internal clock signal INCLK can be approximately equal to the phase of the first delay clock signal DCLKO. That is, the internal clock signal INCLK is outputted with the minutely-decreased phase according to the control signal PMC from the control unit 60. This procedure is repeated until the phase of the internal clock signal INCLK is identical to the phase of the external clock signal EXCLK.

When the phase of the internal clock signal INCLK from the phase mixer 50 is identical to the phase of the first delay clock signal DCLKO according to the control signal PMC from the control unit 60, namely when 'α' is zero (0), if the phase of the internal clock signal INCLK is still slower than that of the external clock signal EXCLK, the control unit 60 outputs the control signal CON to shift right the second shift register 22 of the shift register unit 20 by the shift control unit 23 of the shift register unit 20. Therefore, the first control signal SHEN has a high level and the other control signals SHE1-SHE(N−1) have a low level to form a delay path from the second unit delay cell DELE(2N−1) to the last unit delay cell DELE2N, thereby newly outputting the second delay clock signal DCLKE.

Thereafter, the phase of the internal clock signal INCLK is minutely controlled according to the control signal PMC from the control unit 60. That is, 'α' is gradually increased from '0' so that the phase of the internal clock signal INCLK can be approximately equal to the phase of the first delay clock signal DCLKO. Accordingly, the internal clock signal INCLK is outputted with the minutely-decreased phase. Such a procedure is repeated until the phase of the internal clock signal INCLK is identical to the phase of the external clock signal EXCLK.

When 'α' is one or zero in Formula 1 and the internal clock signal INCLK having the same phase as one of the delay clock signals DCLKO and DCLKE is outputted, the shift right or left is generated not in the variable delay line 11 or 12 outputting the delay clock signal DCLKO or DCLKE having the same phase as the internal clock signal INCLK but in the other variable delay line 11 or 12. As a result, jitter elements do not influence the internal clock signal INCLK having the same phase as the delay clock signal DCLKO or DCLKE.

Figure 6:
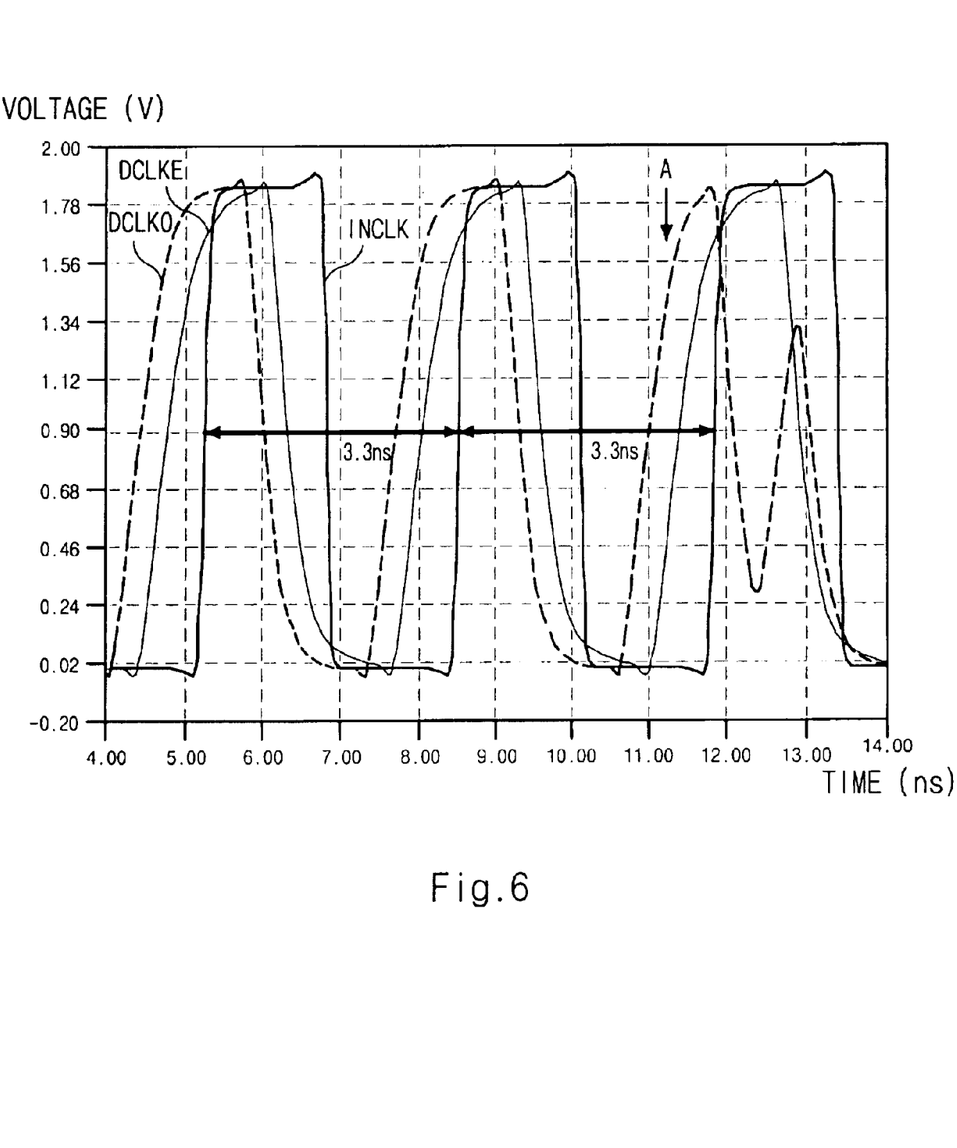
FIG. 6 is a simulation result diagram illustrating a timing of clock signals from the two variable delay lines and an internal clock signal of FIG. 4.

FIG. 6 is a simulation result diagram illustrating timing of the two delay clock signals DCLKO and DCLKE and the internal clock signal INCLK. When the internal clock signal INCLK having the same phase as the second delay clock signal DCLKE is outputted, the shift is generated in time point 'A' in the first variable delay line 11.

As illustrated in FIG. 6, the shift is generated in the first variable delay line 11, and thus a jitter seriously affecting a period, phase and pulse width is shown in the waveform of the first delay clock signal DCLKO. However, the phase mixer 50 receives the second delay clock signal DCLKE, and outputs the internal clock signal INCLK. Therefore, a period, phase and pulse width of the internal clock signal INCLK are not influenced by jitter elements of the first delay clock signal DCLKO.

Figure 7:
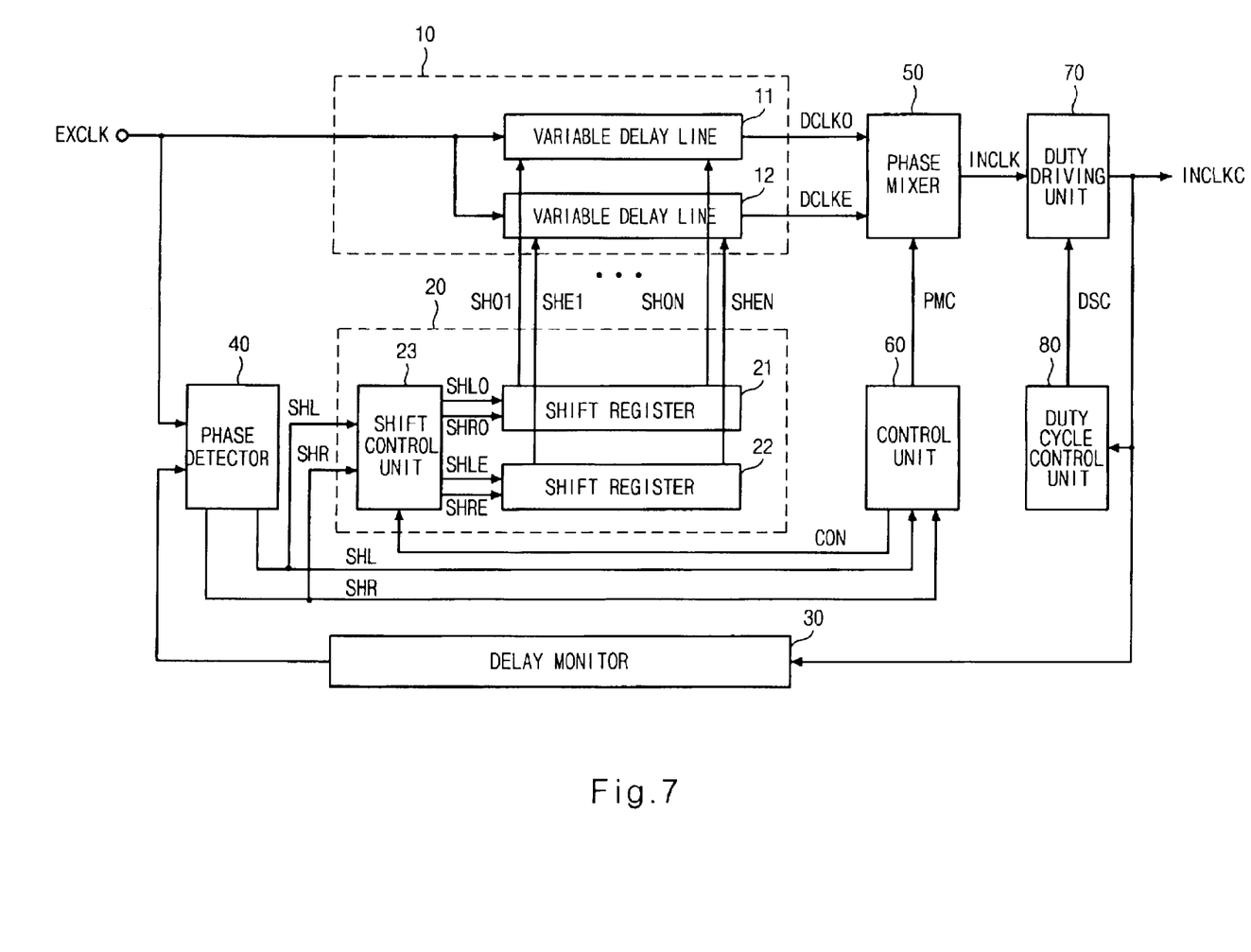
FIG. 7 is a block diagram illustrating a second clock synchronization circuit having a duty cycle control unit for controlling a duty cycle and a duty driving unit.

As shown in FIG. 7, a second clock synchronization circuit includes a variable delay unit 10 having two variable delay lines 11 and 12, a shift register unit 20 having two shift registers 21 and 22 and a delay monitor 30. The second clock synchronization circuit also includes a phase detecting unit 40, a phase mixer 50 and a control unit 60 as in the first clock synchronization circuit. The second clock synchronization circuit further includes the duty driving unit 70 for setting up a level ratio of the clock signal INCLK from the phase mixer 50 and a duty cycle control unit 80 for controlling a ratio of a duty driving unit 70.

The duty driving unit 70 sets up an identical time duration ratio in a high level period and a low level period of the clock signal INCLK from the phase mixer 50 according to a control signal DSC from the duty cycle control unit 80. That is, the duty driving unit 70 is driven so that a duty of the duty cycle of the internal clock signal INCLK can be 50%.

For example, when the internal clock signal INCLK has a frequency of 500 megahertz (MHz), if a period of one clock is 2 nanoseconds (ns) and the duty of the duty cycle is exactly 50%, the high level period and the low level period of the internal clock signal INCLK are each 1ns.

The duty cycle is adjusted because the DDR SDRAM is operated both on a rising edge and a falling edge of the clock signal.

Except for the above-described operation, the second clock synchronization circuit operates in the same manner as the first clock synchronization circuit, and thus detailed explanations thereof will be omitted.

Figure 8:
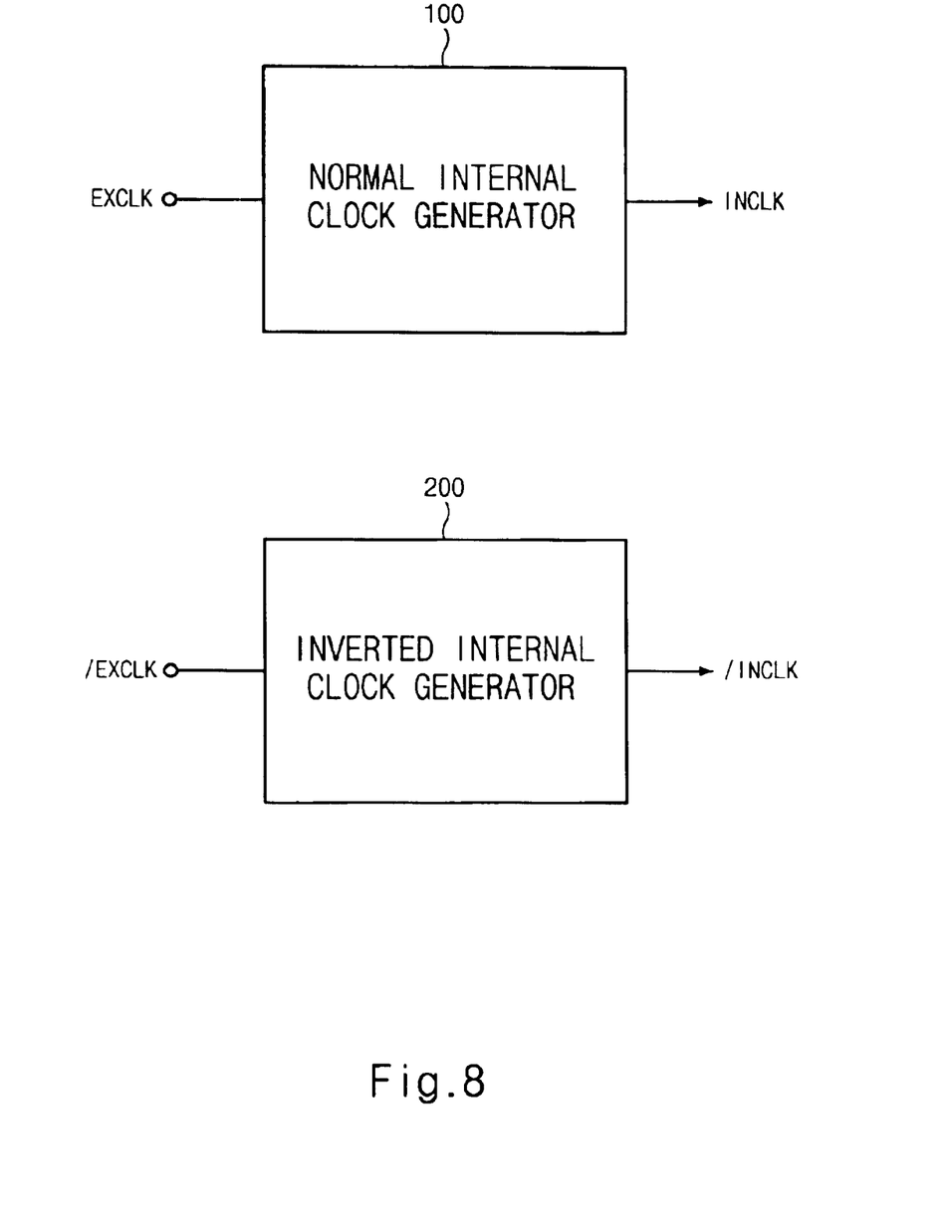
FIG. 8 is a block diagram illustrating third clock synchronization circuits outputting a normal internal clock signal and an inverted internal clock signal.

FIG. 8 is a block diagram illustrating third clock synchronization circuits 100 and 200 outputting a normal internal clock signal INCLK and an inverted internal clock signal/INCLK. As shown in FIG. 8, the normal internal clock generator 100 outputting the normal internal clock signal INCLK includes a variable delay unit having two variable delay lines, a shift register unit having two shift registers, a delay monitor; a phase detecting unit, a phase mixer and a control unit as in the first clock synchronization circuit. The inverted internal clock generator 200 outputting the inverted internal clock signal/INCLK includes a variable delay unit having two variable delay lines, a shift register unit having two shift registers, a delay monitor, a phase detecting unit, a phase mixer, and a control unit as in the first clock synchronization circuit. The inverted clock signal/EXCLK having the opposite phase to the external clock signal EXCLK is inputted to the variable delay unit of the inverted internal clock generator 200, and thus the inverted internal clock generator 200 outputs the inverted internal clock signal/INCLK having the opposite phase to the internal clock signal INCLK from the normal internal clock generator 100.

For example, when the DDR SDRAM is operated in a rising edge of the operation clock signal, the DDR SDRAM is enabled and driven in every rising edge according to the normal internal clock signal INCLK. When the DDR SDRAM is operated in a falling edge of the operation clock signal, the DDR SDRAM is enabled and driven in every rising edge according to the inverted internal clock signal /INCLK. Here, because the normal internal clock signal INCLK has the opposite phase to the inverted internal clock signal/INCLK, a clock signal can be enabled in the same manner as a clock signal having a duty ratio of 50% in a high level period and a low level period.

The normal internal clock generator 100 and the inverted internal clock generator 200 perform the identical operation to the clock synchronization circuit described above, and thus detailed operation explanations thereof will be omitted.

As noted earlier, the disclosed clock synchronization circuit generates the internal clock signal having a phase between the phases of the two clock signals generated in the two variable delay lines with a predetermined phase difference by using the phase mixer to precisely synchronize the clock signal. When the shift register for controlling the variable delay lines performs the shift operation, the output clock signal from the variable delay line where the shift operation is performed is not inputted to the phase mixer, but the output clock signal from the other variable delay line is inputted to the phase mixer. Accordingly, the jitter elements generated due to the shift operation do not influence the internal clock signal.

Moreover, the driving unit and the control unit for adjusting the duty cycle are provided to set up a duty cycle of 50%, thereby improving the operation performance. In addition, the internal clock signals for the rising edge timing and the falling edge timing are respectively generated to improve the operation performance. The disclosed apparatus precisely synchronizes a phase of an external clock signal with a phase of an internal clock signal, regardless of noise generated due to shift in delay lines of a clock synchronization circuit.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A clock synchronization circuit comprising:
   at least two variable delay lines for respectively delaying an external clock signal for a different delay time;
   at least two shift registers for respectively controlling the delay time of the variable delay lines;
   a phase mixer for mixing phases of the clock signals delayed by the variable delay units, and outputting an internal clock signal having a phase between phases of the delayed clock signals;
   a phase detecting unit for comparing the phase of the external clock signal with the phase of the internal clock signal, and outputting a plurality of control signals for controlling the respective shift registers; and
   a control unit for outputting a first control signal for determining the phase of the internal clock signal by controlling the phase mixer, and a second control signal for controlling at least one shift register of the shift registers to perform a shift operation according to the plurality of control signals from the phase detecting unit.

2. The clock synchronization circuit according to claim 1, wherein each of the variable delay lines comprises:
   a plurality of unit delay cells connected in series; and
   a plurality of gates for selectively outputting the external clock signal to the respective unit delay cells according to an output signal from the corresponding shift register.

3. The clock synchronization circuit according to claim 2, wherein each of the variable delay lines shifts at least two unit delay cells according to an output signal from the corresponding shift register.

4. The clock synchronization circuit according to claim 1, wherein the phase mixer mixes phases of at least two clock signals delayed by at least two variable delay lines receiving the phase of the internal clock signal to be a phase of the clock signal having the latest phase among the clock signals.

5. The clock synchronization circuit according to claim 4, wherein a shift control unit controls the shift register for controlling a delay time of at least one variable delay line except for the variable delay line for outputting the clock signal having the latest phase among the clock signals delayed by the variable delay lines to perform the shift operation, when the phase of the internal clock signal outputted by the phase mixer is identical to the phase of the clock signal having the latest phase among the clock signals delayed by the variable delay lines.

6. The clock synchronization circuit according to claim 1, further comprising:
   a duty driving unit for controlling a duty cycle of the internal clock signal from the phase mixer; and
   a duty cycle control unit for detecting the duty cycle of the output signal from the duty driving unit, and controlling the duty driving unit to have the previously-set duty cycle.

7. The clock synchronization circuit according to claim 1, further comprising a shift control unit for controlling at least one shift register to perform a shift operation according to a second control signal from the control unit.

8. A clock synchronization circuit for respectively synchronizing an internal clock signal with an external clock signal and an inverted internal clock signal with an inverted external clock signal having the opposite phase to the external clock signal, the clock synchronization circuit comprising:
   a normal internal clock signal generator for generating a normal internal clock signal wherein the normal internal clock signal generator comprises: at least two variable delay lines for respectively delaying the external clock signal for a different delay time: at least two shift registers for respectively controlling the delay time of the variable delay lines: and a chase mixer for mixing phases of the clock signals delayed by the variable delay lines, and outputting the internal clock signal having a phase between phases of the delayed clock signals; and
   an inverted internal clock signal generator for generating the inverted internal clock signal having the opposite phase to the internal clock signal wherein the inverted internal clock signal generator comprises: at least two variable delay lines for respectively delaying a phase-shifted clock signal fo the external clock signal for a different delay time: at least two shift resisters for respectively controlling the delay time of the variable delay lines: and a phase mixer for mixing phases of the clock signals delayed by the variable delay lines, and outputting the inverted internal clock signal having a phase between phases of the delayed clock signals.

9. The clock synchronization circuit according to claim 8, wherein the normal internal clock signal generator further comprises:
   a phase detecting unit for comparing the phase of the external clock signal with the phase of the internal clock signal, and outputting a plurality of control signals for controlling the respective shift registers; and
   a control unit for outputting a first control signal for determining the phase of the internal clock signal by controlling the phase mixer, and a second control signal for controlling at least one shift register of the shift registers to perform a shift operation according to the plurality of control signals from the phase detecting unit.

10. The clock synchronization circuit according to claim 8, wherein the inverted internal clock signal generator further comprises:
   a phase detecting unit for comparing the phase of the phase-shifted clock signal of the external clock signal with the phase of the inverted internal clock signal, and outputting a plurality of control signals for controlling the respective shift registers; and
   a control unit for outputting a first control signal for determining the phase of the inverted internal clock signal by controlling the phase mixer, and a second control signal for controlling at least one shift register of the shift registers to perform a shift operation according to the plurality of control signals from the phase detecting unit.

* * * * *

UNITED STATES PATENT AND TRADEMARK OFFICE
CERTIFICATE OF CORRECTION

PATENT NO. : 6,768,361 B2 Page 1 of 1
DATED : July 27, 2004
INVENTOR(S) : Jong T. Kwak It is certified that error appears in the above-identified patent and that said Letters Patent is hereby corrected as shown below:

<u>Column 10,</u>
Line 18, please delete "chase" and replace with -- phase --.
Line 29, please delete "fo" and replace with -- to --.
Lines 30-32, please delete "time: at least two shift resisters for respectively controlling the delay time of the variable delay lines:" and replace with -- time; at least two shift registers for respectively controlling the delay time of the variable delay lines; --

Signed and Sealed this

Fourteenth Day of December, 2004

JON W. DUDAS
*Director of the United States Patent and Trademark Office*